United States Patent
Lin et al.

(10) Patent No.: US 9,974,166 B2
(45) Date of Patent: May 15, 2018

(54) CIRCUIT BOARD AND MANUFACTURING METHOD THEREOF

(71) Applicant: Unimicron Technology Corp., Taoyuan (TW)

(72) Inventors: Chun-Ting Lin, Hsinchu County (TW); Tsung-Si Wang, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days. days.

(21) Appl. No.: 15/263,388

(22) Filed: Sep. 13, 2016

(65) Prior Publication Data

US 2018/0027652 A1 Jan. 25, 2018

(30) Foreign Application Priority Data

Jul. 19, 2016 (TW) .............................. 105122697 A

(51) Int. Cl.
| | |
|---|---|
| *H05K 1/09* | (2006.01) |
| *H05K 1/02* | (2006.01) |
| *H05K 1/11* | (2006.01) |
| *H05K 3/00* | (2006.01) |
| *H05K 3/06* | (2006.01) |
| *H05K 3/18* | (2006.01) |

(52) U.S. Cl.
CPC ............. *H05K 1/0296* (2013.01); *H05K 1/09* (2013.01); *H05K 1/115* (2013.01); *H05K 3/007* (2013.01); *H05K 3/064* (2013.01); *H05K 3/181* (2013.01); *H05K 3/188* (2013.01)

(58) Field of Classification Search
CPC .. H05K 1/02; H05K 1/03; H05K 1/09; H05K 1/11; H05K 1/53; H05K 1/115; H05K 1/265; H05K 3/06; H05K 3/07; H05K 3/14; H05K 3/22; H05K 3/45; H05K 3/46; H05K 3/64
USPC ......... 174/255, 66, 251, 253, 256, 257, 261; 257/59, 72, 99, 389, 774
See application file for complete search history.

(56) References Cited

U.S. PATENT DOCUMENTS

| | | | | | |
|---|---|---|---|---|---|
| 5,578,902 | A | * | 11/1996 | Vickers | .................. H01J 29/085 313/336 |
| 5,598,057 | A | * | 1/1997 | Vickers | .................. H01J 29/085 313/495 |
| 5,609,704 | A | * | 3/1997 | Hayama | .................. B82Y 30/00 156/230 |
| 5,655,940 | A | * | 8/1997 | Hodson | ..................... G09G 3/22 313/495 |
| 6,343,171 | B1 | * | 1/2002 | Yoshimura | ......... G02B 6/12002 257/E23.01 |
| 6,611,635 | B1 | * | 8/2003 | Yoshimura | ......... G02B 6/12002 257/E23.01 |

(Continued)

FOREIGN PATENT DOCUMENTS

CN 105374692 3/2016

*Primary Examiner* — Xiaoliang Chen
(74) *Attorney, Agent, or Firm* — JCIPRNET

(57) ABSTRACT

A circuit board including a substrate, a patterned circuit layer and a photo-imaginable dielectric layer is provided. The substrate has a first surface and a second surface opposite to each other. The patterned circuit layer is disposed on the first surface, and a line width of the patterned circuit layer gradually reduces from the first surface towards the second surface. The photo-imaginable dielectric layer is disposed in the substrate corresponding to the patterned circuit layer. In addition, a manufacturing method of the circuit board is also proposed.

9 Claims, 7 Drawing Sheets

(56) References Cited

U.S. PATENT DOCUMENTS

| | | | |
|---|---|---|---|
| 6,690,845 B1* | 2/2004 | Yoshimura | G02B 6/12002 257/E23.01 |
| 6,845,184 B1* | 1/2005 | Yoshimura | G02B 6/12002 257/E23.01 |
| 2002/0039464 A1* | 4/2002 | Yoshimura | G02B 6/10 385/14 |
| 2002/0048630 A1* | 4/2002 | Nakata | G03F 7/40 174/253 |
| 2002/0097962 A1* | 7/2002 | Yoshimura | G02B 6/10 385/50 |
| 2003/0036022 A1* | 2/2003 | Speckbacher | G03F 1/20 430/314 |
| 2003/0170571 A1* | 9/2003 | Nozaki | G03F 7/0035 430/314 |
| 2004/0256984 A1* | 12/2004 | Fuchigami | H01L 27/3246 313/506 |
| 2005/0087769 A1* | 4/2005 | Yamazaki | H01L 27/1214 257/202 |
| 2005/0104068 A1* | 5/2005 | Yamazaki | H01L 21/28114 257/66 |
| 2007/0080360 A1* | 4/2007 | Mirsky | H01L 23/3677 257/99 |
| 2009/0314525 A1* | 12/2009 | Kajino | H05K 1/0265 174/255 |
| 2010/0065852 A1* | 3/2010 | Lin | G02F 1/1345 257/72 |
| 2010/0215313 A1* | 8/2010 | Matsuoka | G02B 6/43 385/14 |
| 2011/0127566 A1* | 6/2011 | Yoon | H01L 33/486 257/99 |
| 2011/0156040 A1* | 6/2011 | Kwack | H01L 27/0207 257/59 |
| 2011/0156165 A1* | 6/2011 | Jang | G02F 1/136213 257/389 |
| 2011/0156995 A1* | 6/2011 | Choi | G02F 1/134363 345/92 |
| 2012/0273963 A1* | 11/2012 | Mirsky | H01L 23/3735 257/774 |
| 2014/0182912 A1* | 7/2014 | Lin | H01L 23/49811 174/261 |
| 2014/0332253 A1* | 11/2014 | Lin | H05K 3/0097 174/251 |
| 2015/0325516 A1* | 11/2015 | Lin | H01L 23/3157 257/774 |
| 2016/0113114 A1* | 4/2016 | Chan | H05K 3/0097 174/251 |

* cited by examiner

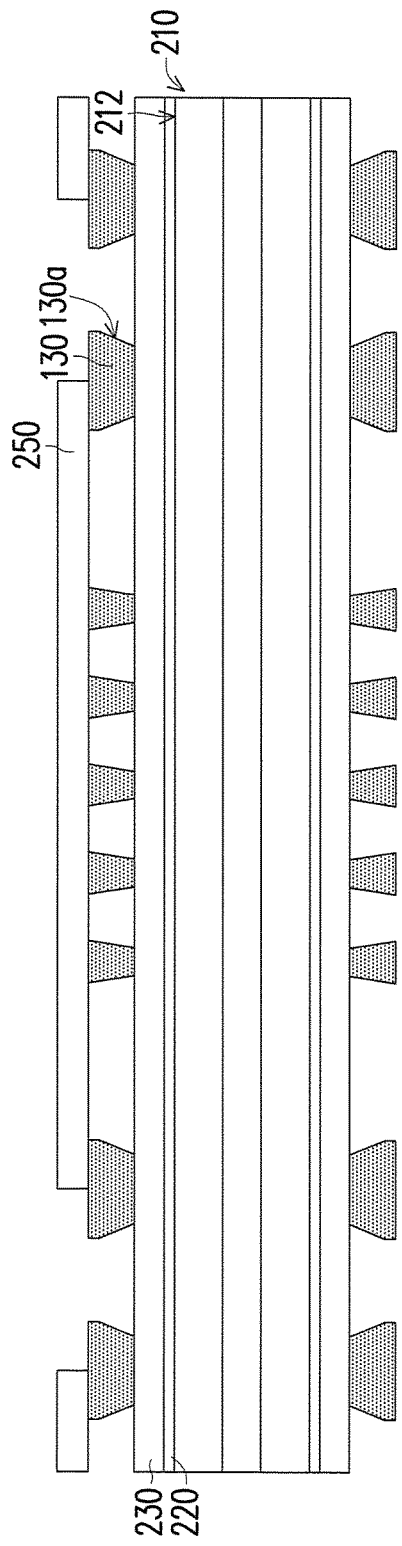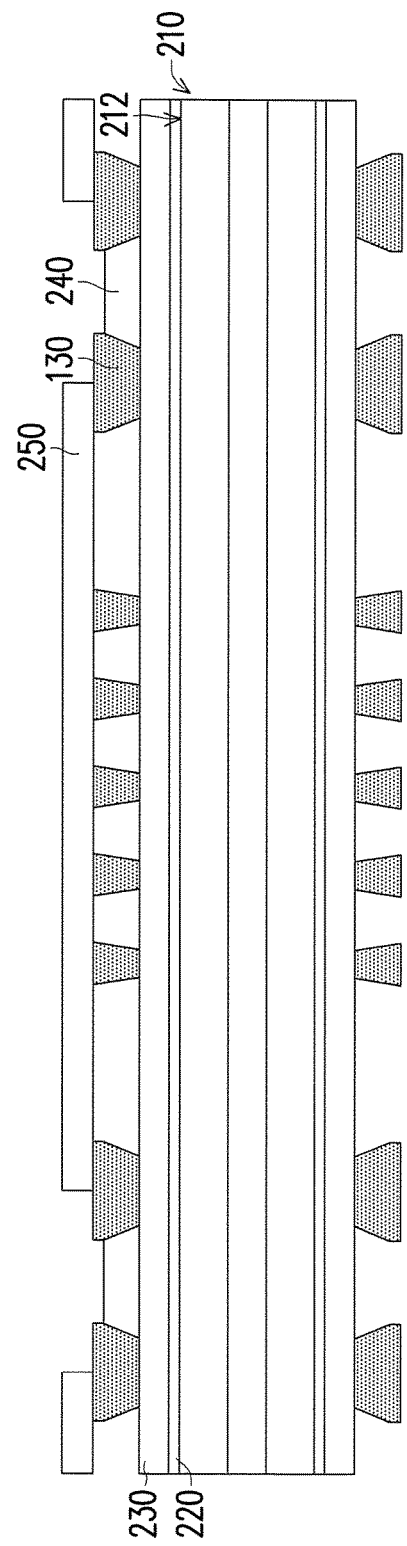

CIRCUIT BOARD AND MANUFACTURING METHOD THEREOF

CROSS-REFERENCE TO RELATED APPLICATION

This application claims the priority benefit of Taiwan application serial no. 105122697, filed on Jul. 19, 2016. The entirety of the above-mentioned patent application is hereby incorporated by reference herein and made a part of this specification.

BACKGROUND OF THE INVENTION

1. Field of the Invention

The invention relates to a circuit board, and more particularly, to a circuit board having a photo-imaginable dielectric layer.

2. Description of Related Art

A common non-embedded circuit board has been developed into an embedded circuit board in the field of circuit board technologies today. Specifically, the common non-embedded circuit board is characterized in that circuits therein protrude onto a surface of a dielectric layer, whereas the embedded circuit board is characterized in that circuits therein are embedded in the dielectric layer.

In the embedded circuit board of single-layer, an insulation material between traces of the circuit board mainly adopts use of a solder mask, for example. Therefore, other than serving as a solder resist material on a surface of the circuit board, the solder mask also serves as a dielectric insulation material between circuits of the circuit board. However, electrical insulation of the solder mask and thermal expansion coefficient (Coefficient of Thermal Expansion; CTE) of the material thereof are not as good as those of the traditional dielectric material. With development trend of electronic device towards miniaturization nowadays, as an area of the circuit board must be reduced correspondingly, a density of the traces on the circuit board must also be relatively increased. Still, as described above, because the electrical insulation of the solder mask in the embedded circuit board of single-layer is not as good as that of the traditional dielectric material, a minimum space between the traces is limited. Accordingly, a design rule for the traces of the circuit board also shows limitations which are disadvantageous in terms of further reduction on the area or thickness of the circuit board.

SUMMARY OF THE INVENTION

The invention is directed to a circuit board, which has a photo-imaginable dielectric layer. The photo-imaginable dielectric layer disposed in a substrate of the circuit board can improve the electrical insulation of the substrate and solve an issue regarding the thermal expansion coefficient matching of the substrate, and a patterned circuit layer with a line width gradually increasing towards a surface of the circuit board may also be formed accordingly.

A circuit board of the invention includes a substrate, a patterned circuit layer and a photo-imaginable dielectric layer. The substrate has a first surface and a second surface opposite to each other. The patterned circuit layer is disposed on the first surface, and a line width of the patterned circuit layer gradually reduces from the first surface towards the second surface. The photo-imaginable dielectric layer is disposed in the substrate corresponding to the patterned circuit layer.

A manufacturing method of the circuit board of the invention includes: providing a first carrier, so that the circuit board may also be implemented above or below which. Specifically, the first carrier has a third surface and a fourth surface opposite to each other. A release film and a first metal layer are respectively disposed on the third surface and the fourth surface in sequence. A photo-imaginable dielectric layer is disposed on the first metal layer, and the photo-imaginable dielectric layer is patterned. A patterned dry film layer is formed on the photo-imaginable dielectric layer, and a part of the first metal layer and the photo-imaginable dielectric layer is exposed by the patterned dry film layer. A second metal layer is electroplated on the part of the first metal layer by using the patterned dry film layer as an electroplating mask. A first surface finish layer is formed on the second metal layer. The patterned dry film layer is removed to expose the photo-imaginable dielectric layer and the first metal layer. The first metal layer is etched by using the photo-imaginable dielectric layer as an etching mask to form a patterned circuit layer on the release film. A solder resist material is coated on the patterned circuit layer and the photo-imaginable dielectric layer to form a substrate, and the first surface finish layer is exposed. The substrate has a first surface and a second surface opposite to each other, and the first surface contacts the release film. A line width of the patterned circuit layer gradually reduces from the first surface towards the second surface. A second carrier is disposed on the second surface, and the first carrier is removed from the first surface through the release film. A second surface finish layer is formed on the patterned circuit layer exposed on the first surface.

In an embodiment of the invention, a cross section outline of the patterned circuit layer is an inverted-trapezoid.

In an embodiment of the invention, the substrate has a plurality of through holes, and the through holes respectively connect the first surface and the second surface.

In an embodiment of the invention, the photo-imaginable dielectric layer correspondingly contacts the patterned circuit layer.

In an embodiment of the invention, the circuit board further includes a first surface finish layer, and the first surface finish layer is exposed on the second surface and covers a bottom surface of a part of the patterned circuit layer.

In an embodiment of the invention, a composite material of the first surface finish layer comprises Ni, Au or an alloy thereof.

In an embodiment of the invention, the circuit board further includes a carrier, and the carrier is disposed on the second surface.

In an embodiment of the invention, a composite material of the substrate comprises a solder resist material.

In an embodiment of the invention, the circuit board further includes a second surface finish layer, which is exposed on the first surface and covers a top surface of the patterned circuit layer.

In an embodiment of the invention, a chip is adapted to be disposed on the first surface to electrically contact the second surface finish layer and the patterned circuit layer.

In an embodiment of the invention, a method of forming the second surface finish layer comprises performing an electroless plating manufacturing process.

Based on the above, in the circuit board and the manufacturing method thereof according to the embodiments of the invention, the photo-imaginable dielectric layer provided in the substrate of the circuit board can improve the electrical insulation of the substrate and solve an issue in which thermal expansion coefficient of the substrate fails to effectively match thermal expansion coefficient of the patterned circuit layer. In addition, because the substrate of the circuit board has the first surface and the second surface opposite to each other and the line width of the patterned circuit layer gradually reduces form the first surface towards to the second surfaces, the patterned circuit layer can have a larger bonding area on the surface of the circuit board so as to facilitate forming chip or wire bonding pads with larger area.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A to FIG. 3I are schematic diagrams of a manufacturing process of the circuit board depicted in FIG. 1.

DESCRIPTION OF THE EMBODIMENTS

Figure 1:
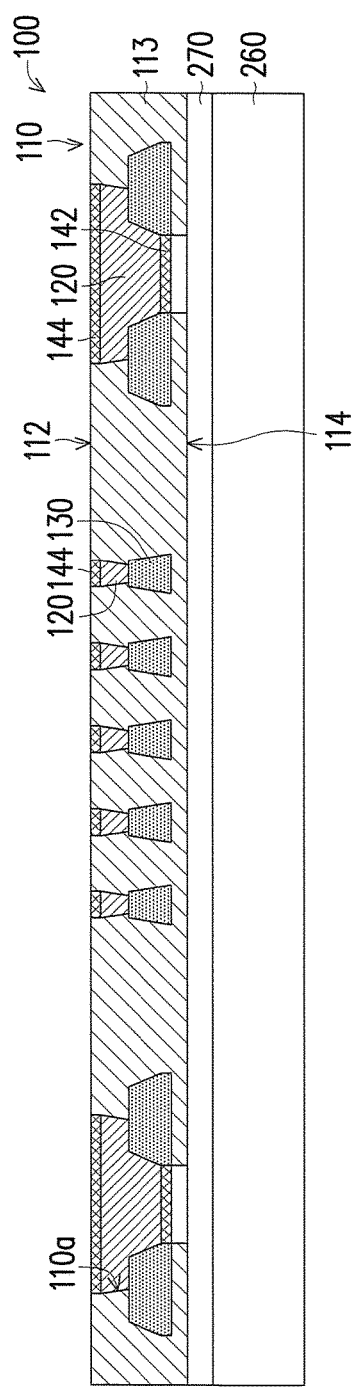
FIG. 1 is a schematic diagram of a circuit board according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram of a circuit board according to an embodiment of the invention. In the present embodiment, a circuit board 100 includes a substrate 110, a patterned circuit layer 120 and a photo-imaginable dielectric layer 130. As shown in FIG. 1, the substrate 110 has a first surface 112 and a second surface 114 opposite to each other. The patterned circuit layer 120 is embedded in the first surface 112 of the substrate, and a line width of the patterned circuit layer 120 gradually reduces from the first surface 112 towards the second surface 114. In the present embodiment, a cross section outline of the patterned circuit layer 120 is, for example, an inverted-trapezoid which is wider at the top and narrower at the bottom.

In the present embodiment, the photo-imaginable dielectric layer 130 is disposed in the substrate 110 corresponding to the patterned circuit layer 120, and the photo-imaginable dielectric layer 130 and the patterned circuit layer 120 correspondingly contact each other. Further, the circuit board 100 includes a first surface finish layer 142 and a second surface finish layer 144, respectively serving as bonding pads for solder bumps, traces or chips. As shown in FIG. 1, the first surface finish layer 142 is disposed on a bottom surface of a part of the patterned circuit layer 120. The second surface finish layer 144 is disposed on a top surface of the patterned circuit layer 120 and exposed on the first surface 112. Furthermore, as shown in FIG. 1, the circuit board 100 further includes a carrier 260, which is disposed on the second surface 114 of the substrate 110, and a release film 270 is provided between the substrate 110 and the carrier 260.

In the present embodiment, the substrate 110 is mainly composed of a solder resist material 113, and the solder resist material 113 is, for example, a solder mask or other similar dielectric materials. In addition, composite materials of the first surface finish layer 142 and the second surface finish layer 144 are, for example, Ni, Au or an alloy material of aforesaid metals. As shown in FIG. 1, the solder resist material 113 may expose the second surface finish layer 144 disposed on the patterned circuit layer 120. In the present embodiment, the solder resist material 113 may be used as a solder resist layer on the surface of the substrate 110 and a dielectric insulation layer between the circuits at the same time. Furthermore, the first surface 112 of the substrate 110 has a plurality of openings 110a, and the openings 110a may be filled with the circuit layer and the solder resist material by electroplating or electroless plating.

In the present embodiment, electrical insulation of the solder resist material 113 composing the substrate 110 and matching of thermal expansion coefficient of the material thereof are not as good as those of the traditional dielectric material. Therefore, the photo-imaginable dielectric layer 130 is further disposed in the substrate 110 in the present embodiment to effectively improve the electrical insulation of the substrate 110 and solve the matching issue of the thermal expansion coefficients of the materials.

Specifically, in the present embodiment, an overall thickness of the circuit board 100 may be effectively reduced by directly using the solder resist material 113 as the dielectric insulation material of the substrate 110 for the circuit board 100 without additionally disposing other dielectric layers in the circuit board 100. Nonetheless, when the chip (not illustrated) is subsequently disposed on the substrate 110, stress and strain generated in relative to a difference between the thermal expansion coefficients of the chip and the substrate 110 can easily cause damages on the chip. Accordingly, in the present embodiment, because the matching issue of the thermal expansion coefficients between the substrate 110 and the chip may be solved by disposing the photo-imaginable dielectric layer 130 in the substrate 110 to slow down the stress and strain generated by the difference between the thermal expansion coefficients of the chip and the substrate 110, the damages on the chip may be reduced.

Referring back to FIG. 1, in the present embodiment, the cross section outline of the patterned circuit layer 120 is the inverted-trapezoid wider at the top and narrower at the bottom in the first surface 112 and the openings 110a of the substrate 110. Therefore, the chip or the wire bonding pads with larger area may be formed on the patterned circuit layer 120 of the first surface 112 of the substrate 110.

Figure 2:
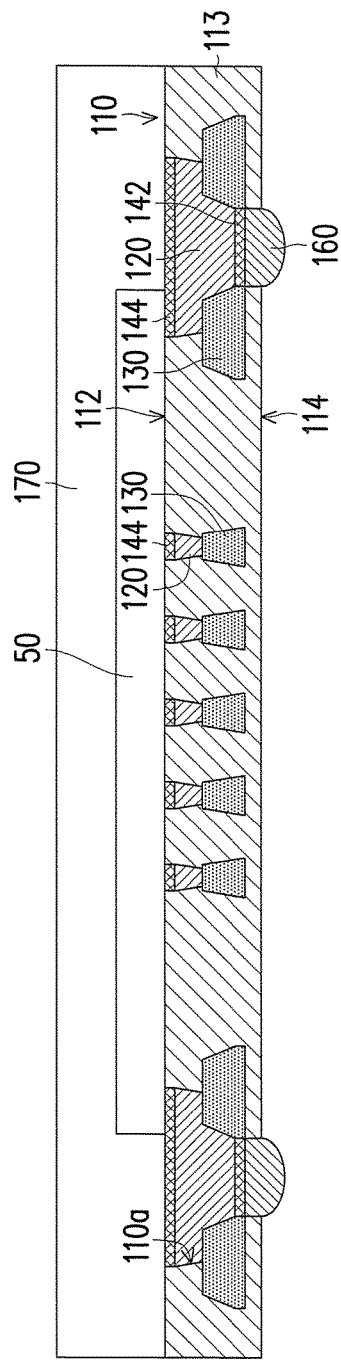
FIG. 2 is a schematic diagram of a circuit board according to another embodiment of the invention.

FIG. 2 is a schematic diagram of a circuit board according to another embodiment of the invention. A difference between the present embodiment and the embodiment of FIG. 1 is that, a chip 50 may be disposed on the first surface 112 of the substrate 110, and the chip is electrically connected to the second surface finish layer 144 exposed on the first surface 112 and the patterned circuit layer 120. Further, after the chip 50 is disposed, the carrier 260 disposed on the second surface 114 of the substrate 110 may be removed from the second surface 114 through the release film 270. Furthermore, a bumping process may be performed on the first surface finish layer 142 exposed on the second surface 114 of the substrate 110 in order to form a solder bump 160. Accordingly, the chip 50 may be electrically connected to other chips or the circuit board via the solder bump 160. In the present embodiment, a molding compound 170 may be disposed on the first surface 112 of the substrate 110 to cover the chip 50 and the patterned circuit layer 120 and provide protection thereto.

Figure 3A:
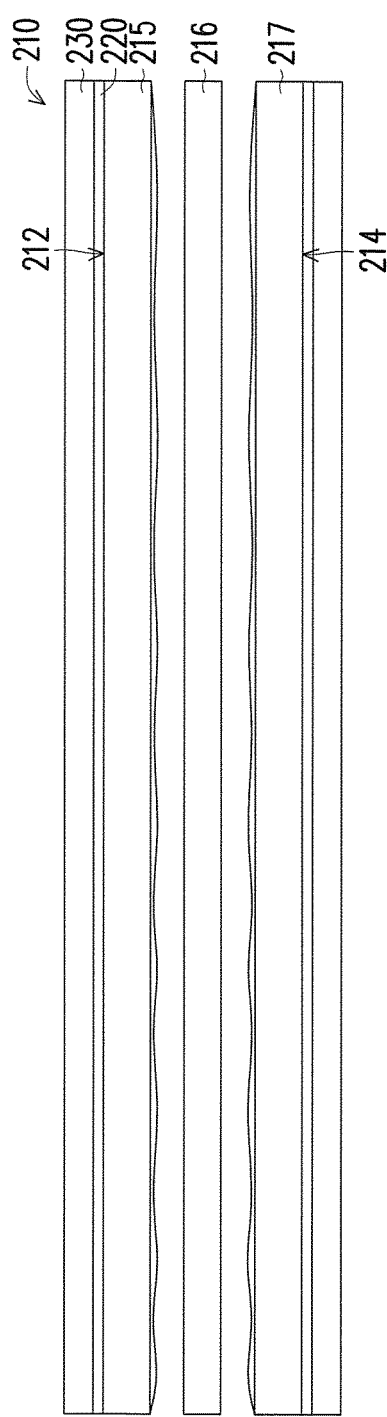

FIG. 3A to FIG. 3I are schematic diagrams illustrating a flow in a manufacturing method of the circuit board depicted in FIG. 1. Referring to FIG. 3A to FIG. 3I, a step of the manufacturing method of the circuit board 100 includes: providing a first carrier 210 (as shown in FIG. 3A). In the present embodiment, the first carrier 210 has a third surface 212 and a fourth surface 214 opposite to each other, and a release film 220 and a first metal layer 230 are respectively disposed on the third surface 212 and the fourth surface 214 in sequence. The first metal layer 230 of the present embodiment is, for example, a copper layer. As shown in FIG. 3A, the first carrier 210 of the present embodiment may be a multi-layer carrier commonly composed of an upper carrier 215 and a lower carrier 217, and the upper carrier 215 and the lower carrier 217 are adhered and attached to each other by an adhesive layer 216.

Figure 3B:
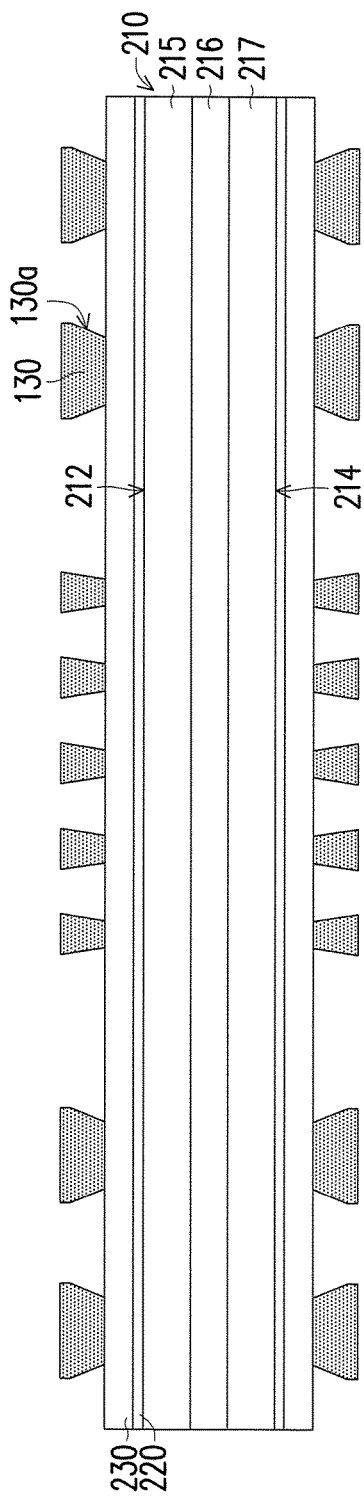

Next, as shown in FIG. 3B, the photo-imaginable dielectric layer 130 being patterned may be bonded on the first metal layer 230 of the third surface 212 and the fourth surface 214. In the present embodiment, the photo-imaginable dielectric layer 130 bonded on the first metal layer 230 is first patterned through a lithography process, and a plurality of through holes 130a are formed therein to facilitate in exposing a part of the first metal layer 230 in the subsequent manufacturing process. In the present embodiment, the upper carrier 215 and the lower carrier 217 and the release film 220 and the first metal layer 230 on the respective surfaces of the upper carrier 215 and the lower carrier 217 are manufactured subsequently by the same manufacturing process. Therefore, the following drawings and descriptions take only the manufacturing process performed on the upper carrier 215 and the third surface 212 as an example for the description, whereas the related manufacturing process performed on the lower carrier 217 and the fourth surface 214 are not repeatedly described and illustrated.

As shown in FIG. 3C, a patterned dry film layer 250 may be formed on the photo-imaginable dielectric layer 130, and the patterned dry film layer 250 exposes a part of the photo-imaginable dielectric layer 130, the through holes 130a therein and a part of the first metal layer 230. Next, as shown in FIG. 3D, the patterned dry film layer 205 and said part of the photo-imaginable dielectric layer 130 may serve as an electroplating mask for electroplating a second metal layer 240 on a surface of the part of the first metal layer 230 in the through holes 130a. In the present embodiment, the second metal layer 240 is, for example, an electroplated copper layer.

Figure 3E:
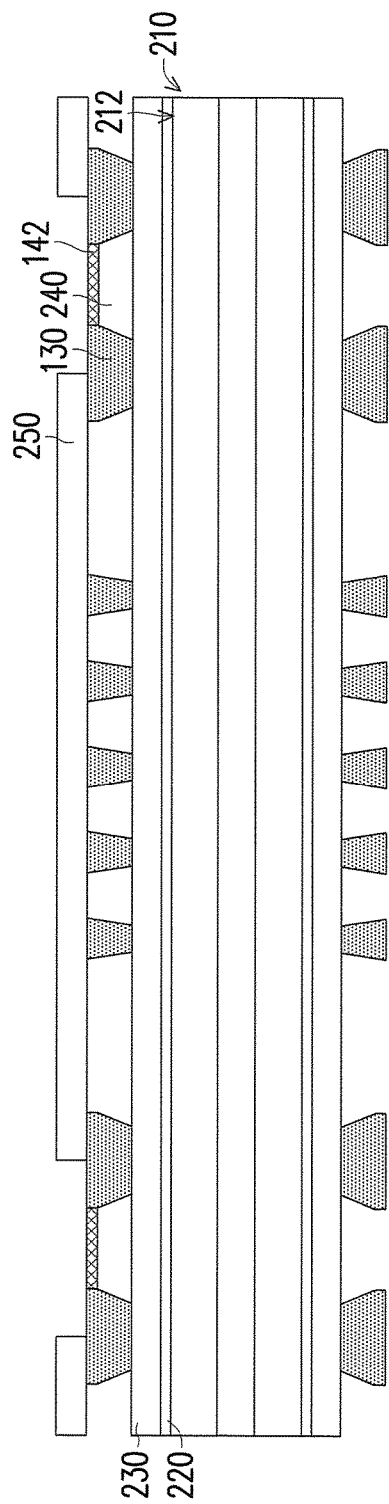
Figure 3F:
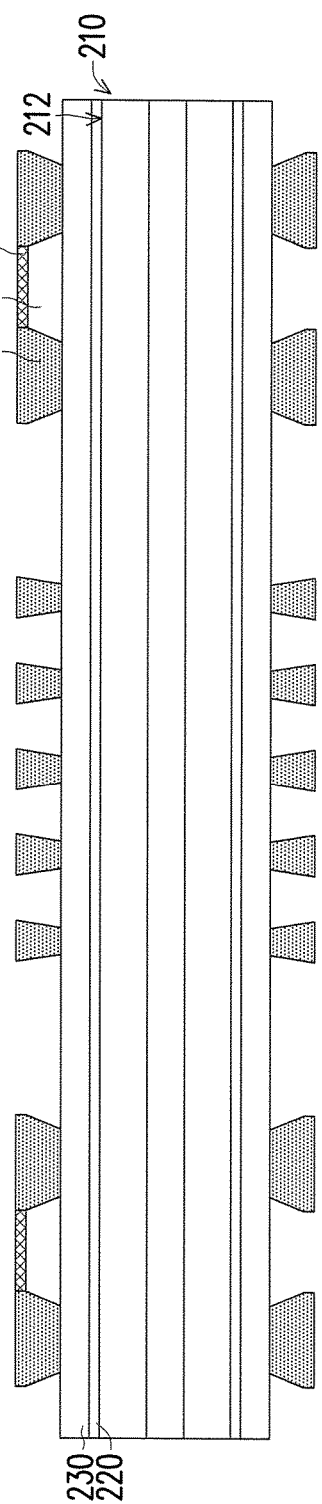

As shown in FIG. 3E, the first surface finish layer 142 may then be formed on the second metal layer 240. In the present embodiment, the area of first surface finish layer 142 may serve as a solder pad of the solder bump 160 in a subsequent bumping process of the circuit board 100. Then, as shown in FIG. 3F, the patterned dry film layer 250 is removed to expose the rest of the photo-imaginable dielectric layer 130 and the first metal layer 230 sheltered by the patterned dry film layer 250.

Figure 3G:
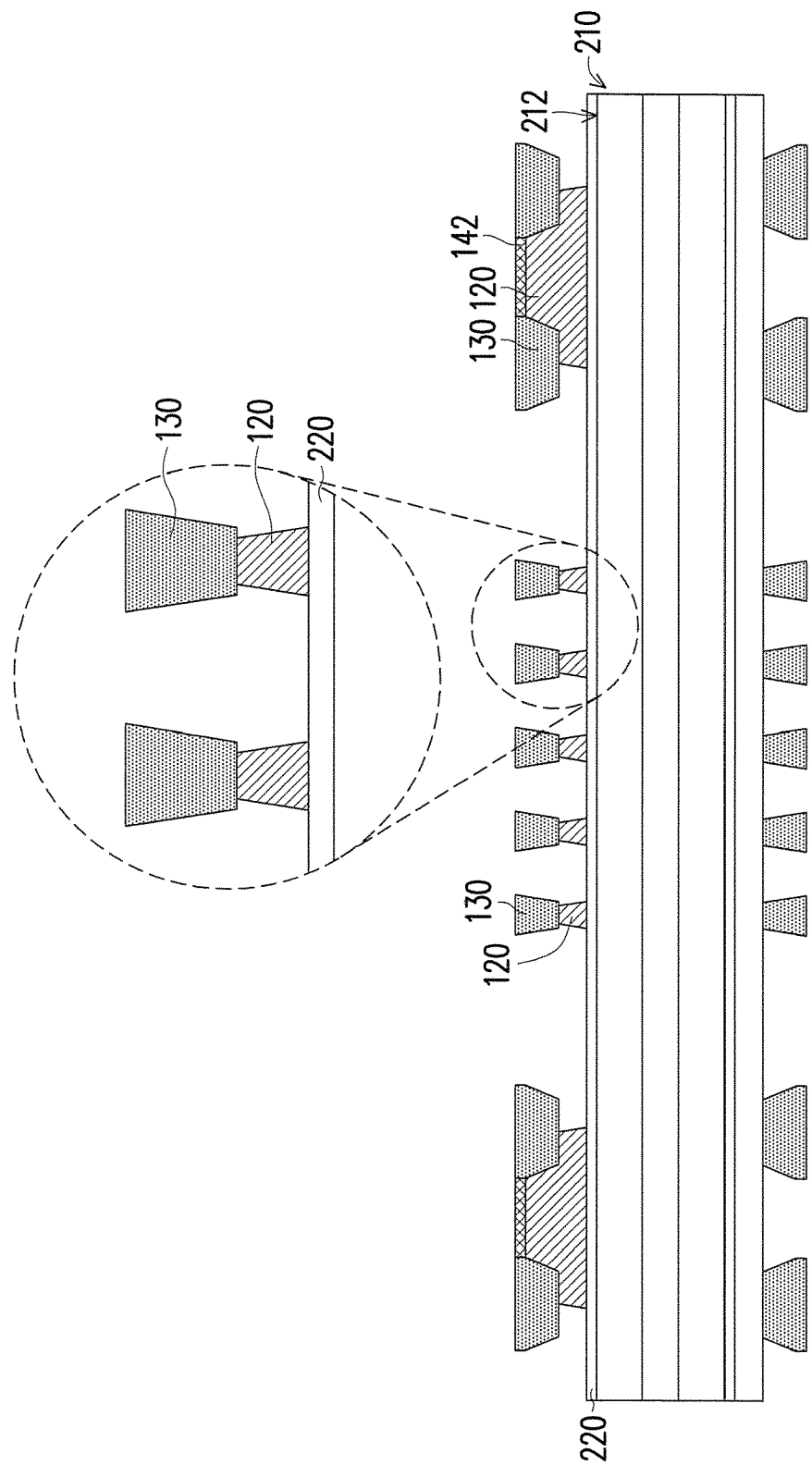

Next, as shown in FIG. 3G, the photo-imaginable dielectric layer 130 may serve as an etching mask for etching the rest of the first metal layer 230, so as to form the patterned circuit layer 120 on the release film 220 of the third surface 212.

Figure 3H:
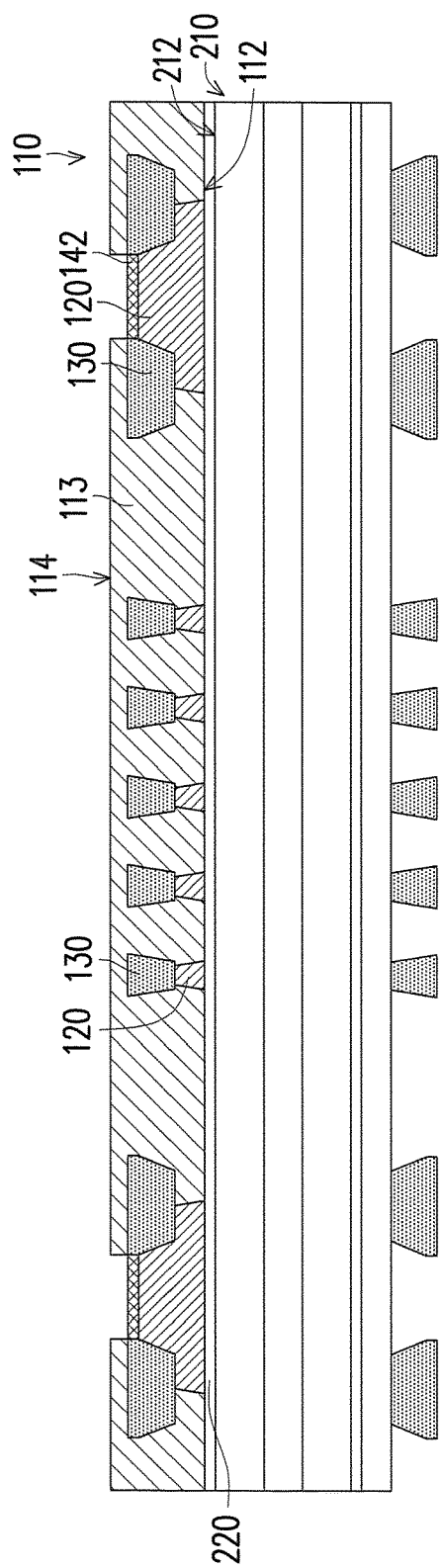

Next, as shown in FIG. 3H, the solder resist material 113 is coated on the patterned circuit layer 120 and the photo-imaginable dielectric layer 130 to form the substrate 110, and the first surface finish layer 142 is exposed by the solder resist material 113. Aforesaid substrate 110 has the first surface 112 and the second surface 114 opposite to each other. In addition, the release film 220 on the third surface 212 of the first carrier 210 and the first surface 112 of the substrate 110 contact each other. As shown in FIG. 3H, the cross section outline of the patterned circuit layer 120 gradually reduces from the first surface 112 towards the second surface 114.

Figure 3I:
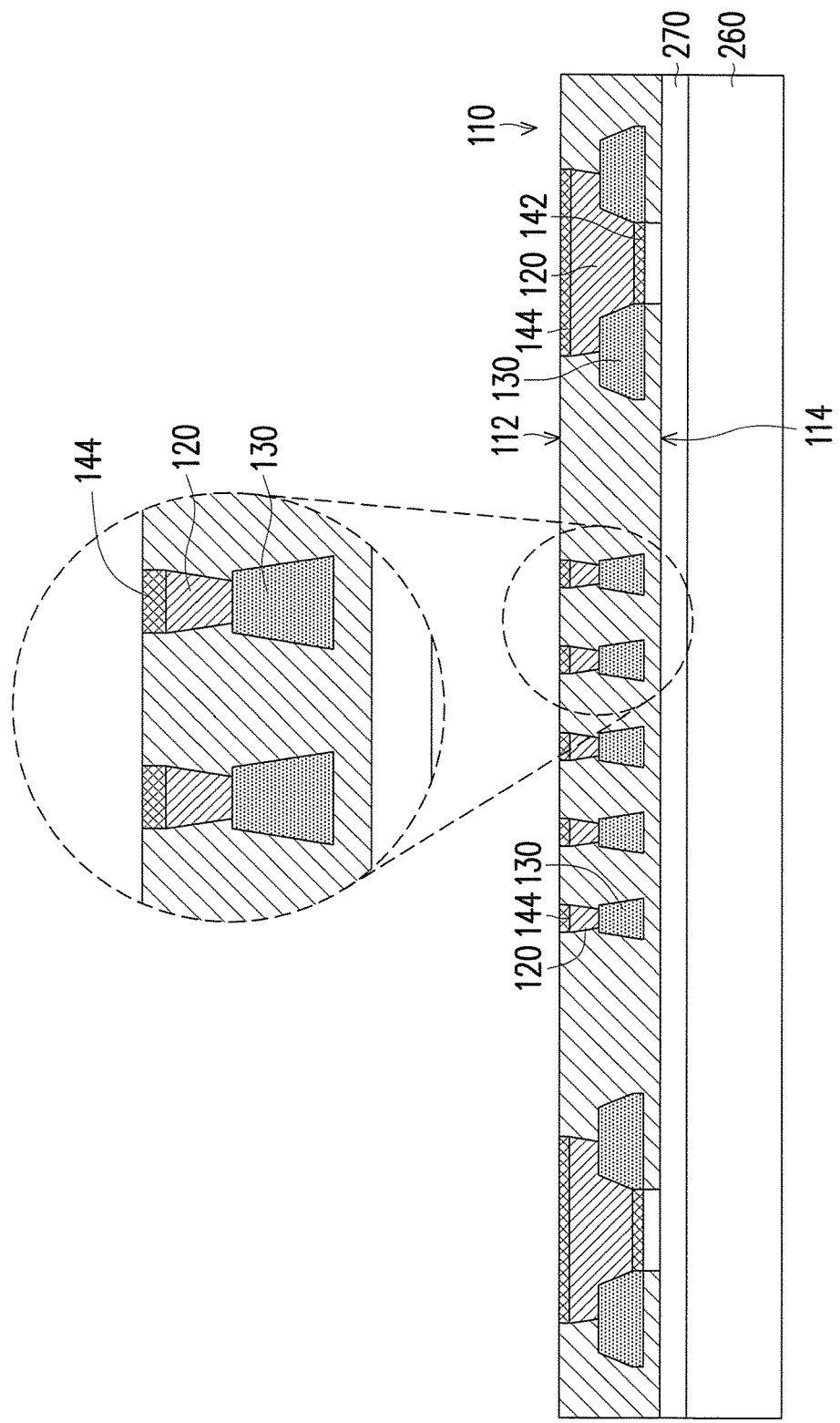

As shown in FIG. 3I, the second carrier 260 is attached on the second surface 114 of the substrate 110, and the release film 270 is provided between the second carrier 260 and the substrate 110. Next, the first carrier 210 on the first surface 112 of the substrate 110 is removed through the release film 220. Then, the second surface finish layer 144 is formed on the patterned circuit layer 120 exposed on the first surface 112 of the substrate 110 by, for example, an electroless plating manufacturing method. At this point, the circuit board 100 is substantially manufactured.

In the manufacturing process of the circuit board 100 according to the invention, because the photo-imaginable dielectric layer 130 may be directly used as electroplating mask and etching mask, it is not required to additionally dispose other dry films or photo resist layers when electroplating the second metal layer 240 and the first surface finish layer 142 thereon as well as when etching the first metal layer 230. In addition, during the manufacturing process of the circuit board 100, when the second metal layer 240 is electroplated, the first surface finish layer 142 may be directly electroplated on the second metal layer 240 to serve as the solder pad for the bumping process so the solder bump 160 may be formed on the first surface finish layer 142 in the subsequent manufacturing process. In other words, in the manufacturing method of the present embodiment, the solder pad for the bumping process is manufactured together while manufacturing the circuit board 100. Therefore, in the subsequent manufacturing process, the solder bump 160 may be soldered on the surface of the circuit board 100 so the chip 50 disposed on the circuit board 100 may be electrically connected to other chips or the carrier via the solder bump 160.

In summary, in the circuit board and the manufacturing method thereof according to the embodiments of the invention, the photo-imaginable dielectric layer may serve as the electroplating mask or the etching mask for electroplating the second metal layer and the first surface finish layer or etching the first metal layer in order to form the patterned circuit layer. Further, after the circuit board is manufactured, the photo-imaginable dielectric layer may be embedded in the substrate of the circuit board to improve the electrical insulation of the substrate and solve the matching issue of the thermal expansion coefficients between materials of the substrate with the chip and the patterned circuit layer. Furthermore, in the manufacturing method of the circuit board according to the invention, the solder pad for the bumping process may be electroplated during the manufacturing process of the circuit board to further simplify the steps in the manufacturing process of the circuit board.

In addition, in the embodiments of the invention, the cross section outline of the patterned circuit layer of the circuit board may be the inverted-trapezoid wider at the top and narrower at the bottom, so as to increase the areas of the chips or the wire bonding pads of the patterned circuit layer on the surface of the circuit board.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board, comprising:
   a substrate, having a first surface and a second surface opposite to each other;
   a patterned circuit layer, embedded in the first surface, and a line width of the patterned circuit layer gradually reducing from the first surface towards the second surface;
   a patterned photo-imaginable dielectric layer, embedded in the substrate corresponding to the patterned circuit layer; and
   a first surface finish layer, exposed on the second surface and only covering a bottom surface of a part of the patterned circuit layer.

2. The circuit board according to claim 1, wherein a cross section outline of the patterned circuit layer is an inverted-trapezoid.

3. The circuit board according to claim 1, wherein the substrate has a plurality of through holes respectively connecting the first surface and the second surface.

4. The circuit board according to claim 1, wherein the patterned photo-imaginable dielectric layer correspondingly contacts the patterned circuit layer.

5. The circuit board according to claim 1, wherein a composite material of the first surface finish layer comprises Ni, Au or an alloy thereof.

6. The circuit board according to claim 1, further comprising: a carrier, disposed on the second surface of the substrate.

7. The circuit board according to claim 1, wherein a composite material of the substrate comprises a solder resist material.

8. The circuit board according to claim 1, further comprising: a second surface finish layer, exposed on the first surface and covering a top surface of the patterned circuit layer.

9. The circuit board according to claim 8, wherein a chip is adapted to be disposed on the first surface to electrically contact the second surface finish layer and the patterned circuit layer.

* * * * *